United States Patent
Nishikawa et al.

(10) Patent No.: US 11,329,327 B2
(45) Date of Patent: *May 10, 2022

(54) ELECTRICITY STORAGE SYSTEM AND MANAGEMENT DEVICE

(71) Applicant: Panasonic Intellectual Property Management Co., Ltd., Osaka (JP)

(72) Inventors: Kazufumi Nishikawa, Osaka (JP); Shinya Nishikawa, Osaka (JP); Tohru Watanabe, Gifu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 121 days.

This patent is subject to a terminal disclaimer.

(21) Appl. No.: 16/637,923

(22) PCT Filed: Aug. 3, 2018

(86) PCT No.: PCT/JP2018/029194
§ 371 (c)(1),
(2) Date: Feb. 10, 2020

(87) PCT Pub. No.: WO2019/049571
PCT Pub. Date: Mar. 14, 2019

(65) Prior Publication Data
US 2020/0176829 A1  Jun. 4, 2020

(30) Foreign Application Priority Data
Sep. 11, 2017  (JP) .............................. JP2017-174086

(51) Int. Cl.
*H01M 10/44* (2006.01)
*G01R 31/389* (2019.01)
(Continued)

(52) U.S. Cl.
CPC ........ *H01M 10/443* (2013.01); *G01R 31/389* (2019.01); *H01M 10/486* (2013.01);
(Continued)

(58) Field of Classification Search
CPC ............. H01M 10/482; H01M 10/441; H01M 10/443; H01M 10/448; H01M 10/486;
(Continued)

(56) References Cited

U.S. PATENT DOCUMENTS 8,583,389 B2 * 11/2013 Aoshima ................. B60L 58/16
702/63
10,361,467 B2 * 7/2019 Kubo .................... H01M 50/20
(Continued)

FOREIGN PATENT DOCUMENTS

JP    2004-215459        7/2004
JP    2010-088202 A      4/2010
(Continued)

OTHER PUBLICATIONS

International Search Report of PCT application No. PCT/JP2018/029194 dated Sep. 11, 2018.
(Continued)

*Primary Examiner* — Helen Rossoshek
(74) *Attorney, Agent, or Firm* — McDermott Will & Emery LLP

(57) ABSTRACT

A managing device calculates a whole state of power (SOP) that is an SOP of a whole of the plurality of power storage blocks based on SOPs of the respective power storage blocks and currents flowing through the respective power storage blocks, and sets an upper limit value of power or a current for at least one of charging and discharging by a power converter, based on the whole SOP thus calculated. The managing device estimates a current flowing through each of the power storage blocks from a voltage and an
(Continued)

internal resistances of each of the power storage blocks before the power converter starts power conversion.

7 Claims, 7 Drawing Sheets

(51) Int. Cl.
| | | |
|---|---|---|
| H01M 10/48 | (2006.01) | |
| H02J 3/32 | (2006.01) | |
| H02J 3/38 | (2006.01) | |
| H02J 7/00 | (2006.01) | |
| H02J 7/04 | (2006.01) | |

(52) U.S. Cl.
CPC .............. *H02J 3/32* (2013.01); *H02J 3/38* (2013.01); *H02J 7/0013* (2013.01); *H02J 7/04* (2013.01); *H02J 2207/20* (2020.01)

(58) Field of Classification Search
CPC .. H02J 2207/20; H02J 3/32; H02J 3/38; H02J 7/0013; H02J 7/00304; H02J 7/04; H02J 7/0047; H02J 7/0048; H02J 7/02; Y02E 60/10; B60L 2240/545; B60L 2240/547; B60L 2240/549; B60L 3/04; B60L 58/13; B60L 58/18; G01R 31/389
See application file for complete search history.

(56) References Cited

U.S. PATENT DOCUMENTS

| | | | |
|---|---|---|---|
| 11,043,821 B2* | 6/2021 | Nishikawa | H02J 7/00304 |
| 2004/0138785 A1 | 7/2004 | Emori et al. | |
| 2013/0293198 A1 | 11/2013 | Nakashima et al. | |
| 2014/0103933 A1* | 4/2014 | Gibbs | B60L 58/12 |
| | | | 324/427 |
| 2015/0258897 A1* | 9/2015 | Okada | B60L 3/04 |
| | | | 318/376 |
| 2015/0364797 A1 | 12/2015 | Inaba et al. | |
| 2017/0126052 A1 | 5/2017 | Toki | |
| 2018/0090962 A1 | 3/2018 | Cha et al. | |
| 2019/0346511 A1 | 11/2019 | Lim et al. | |
| 2020/0161875 A1 | 5/2020 | Nishikawa et al. | |
| 2020/0169105 A1* | 5/2020 | Watanabe | H02J 7/00306 |
| 2021/0129683 A1* | 5/2021 | Yamasaki | B60L 3/00 |
| 2021/0168964 A1* | 6/2021 | Nakaya | H02J 7/0063 |

FOREIGN PATENT DOCUMENTS

| | | |
|---|---|---|
| JP | 2014-193040 | 10/2014 |
| JP | 2017-028801 | 2/2017 |
| WO | 2014/128941 A1 | 8/2014 |
| WO | 2015/189983 | 12/2015 |

OTHER PUBLICATIONS

Notice of Allowance issued in U.S. Appl. No. 16/617,556, dated Mar. 4, 2021.
Non-Final Office Action issued in U.S. Appl. No. 16/617,563, dated May 27, 2021.
Notice of Allowance issued in U.S. Appl. No. 16/617,563, dated Sep. 1, 2021.
Notice of Allowance issued in U.S. Appl. No. 16/617,563, dated Dec. 16, 2021.
International Search Report of PCT Application No. PCT/JP2018/016898 dated May 29, 2018.
International Search Report of PCT Application No. PCT/JP2018/016899 dated Jun. 12, 2018.

* cited by examiner

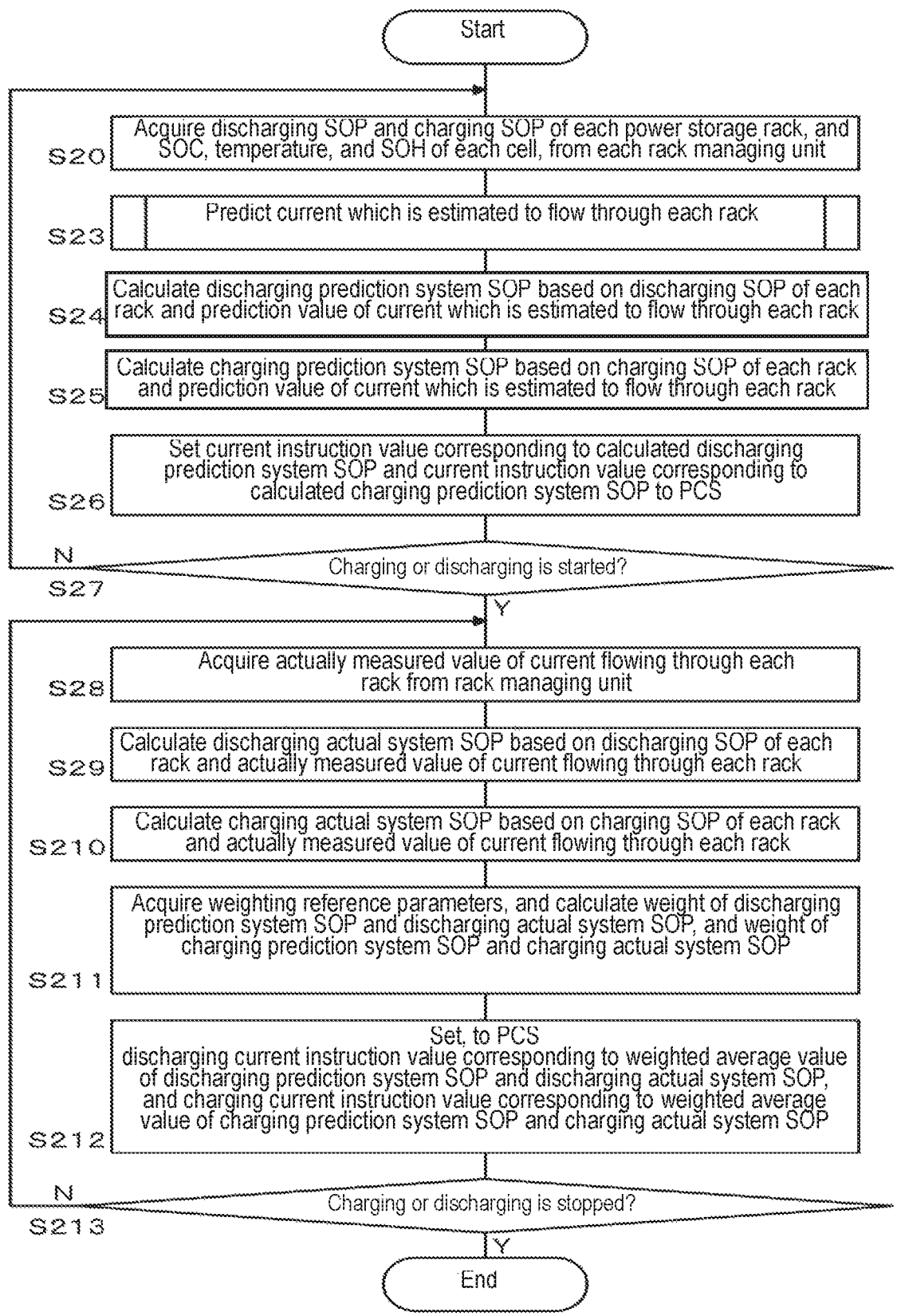

ELECTRICITY STORAGE SYSTEM AND MANAGEMENT DEVICE

CROSS-REFERENCE TO RELATED APPLICATIONS

This application is a U.S. national stage application of the PCT International Application No. PCT/JP2018/029194 filed on Aug. 3, 2018, which claims the benefit of foreign priority of Japanese patent application 2017-174086 filed on Sep. 11, 2017, the contents all of which are incorporated herein by reference.

TECHNICAL FIELD

The present invention relates to a power storage system in which a plurality of power storage blocks are connected to each other in parallel, and a management device.

BACKGROUND ART

Recently, power storage systems have been widespread and are used for peak shift, backup, frequency regulation (FR), and other purposes. A large-scale power storage system is constructed by, for example, connecting in parallel a plurality of power storage blocks each formed by connecting a plurality of power storage modules to each other in series. In this specification described hereinafter, it is assumed that the power storage block is a power storage rack formed by stacking a plurality of power storage modules to each other.

Even in a case where a kind and the number of cells are equal between power storage racks connected in parallel, there may be a case where the cells are different from each other in internal resistance due to voltage difference, the capacity difference, temperature difference and the like between the cells. In this case, resistance difference occurs between power storage racks, and irregularities in current occur between the power storage racks. When irregularities (=variations, or dispersions) in current occur between the power storage racks, there is a possibility that a current concentrates on a particular power storage rack thus giving rise to a possibility that the current exceeds a maximum allowable current of the power storage rack.

To prevent a current from exceeding a maximum allowable current of each power storage rack by suppressing the occurrence of irregularities in current between the power storage racks which are connected in parallel, there has been proposed a method of slowly changing an instruction value by setting an upper limit to a change width of the instruction value to a power conditioner (for example, see PTL 1).

CITATION LIST

Patent Literature

PTL 1: Unexamined Japanese Patent Publication No. 2014-193040

SUMMARY OF THE INVENTION

Technical Problem

In the above-mentioned method, a change of an instruction value is slow and hence, it is difficult to supply necessary electricity instantaneously. Rising of the power storage rack at the time of starting charging or discharging also becomes slow. Further, in a case where the resistance difference exists constantly between the power storage racks due to temperature difference, capacity difference or the like, even when an instruction value is changed slowly, such an operation does not always contribute to the suppression of the occurrence of irregularities (=variations, or dispersions) in electric current.

The present invention has been made in view of such circumstances, and it is an object of the present invention to provide a technique which allows a power storage system in which a plurality of power storage blocks are connected in parallel to ensure a necessary current as much as possible without generating a current which exceeds a maximum allowable current of each power storage block.

Solutions to Problems

To overcome the above-mentioned drawbacks, a power storage system according to an aspect of the present invention includes: a plurality of power storage blocks connected in parallel; a power converter (power conditioning system (PCS)) that converts direct current (DC) power discharged from the plurality of power storage blocks into alternating current (AC) power to output the AC power to a power system (power grid) or a load, and converts AC power inputted from the power system into DC power to charge the DC power to the plurality of power storage blocks; and a managing unit that calculates a whole state of power (SOP) that is an SOP of a whole of the plurality of power storage blocks based on SOPs of the respective power storage blocks and currents flowing through the respective power storage blocks, and sets an upper limit value of power or a current for at least one of charging and discharging by the power converter based on the whole SOP thus calculated, wherein the managing unit estimates a current flowing through each of the power storage blocks from a voltage and an internal resistance of each of the power storage blocks before the power converter starts power conversion. The managing unit estimates a current flowing through each power storage block from a voltage and an internal resistance of each power storage block before the power converter starts power conversion.

Advantageous Effect of Invention

According to the present invention, a power storage system where a plurality of power storage blocks are connected in parallel can ensure a necessary current as much as possible without generating a current which exceeds a maximum allowable current of each power storage block.

BRIEF DESCRIPTION OF DRAWINGS

FIG. 4 is a flowchart showing a flow of the manner of operation of the power storage system according to a second exemplary embodiment of the present invention.

DESCRIPTION OF EMBODIMENTS

Figure 1:
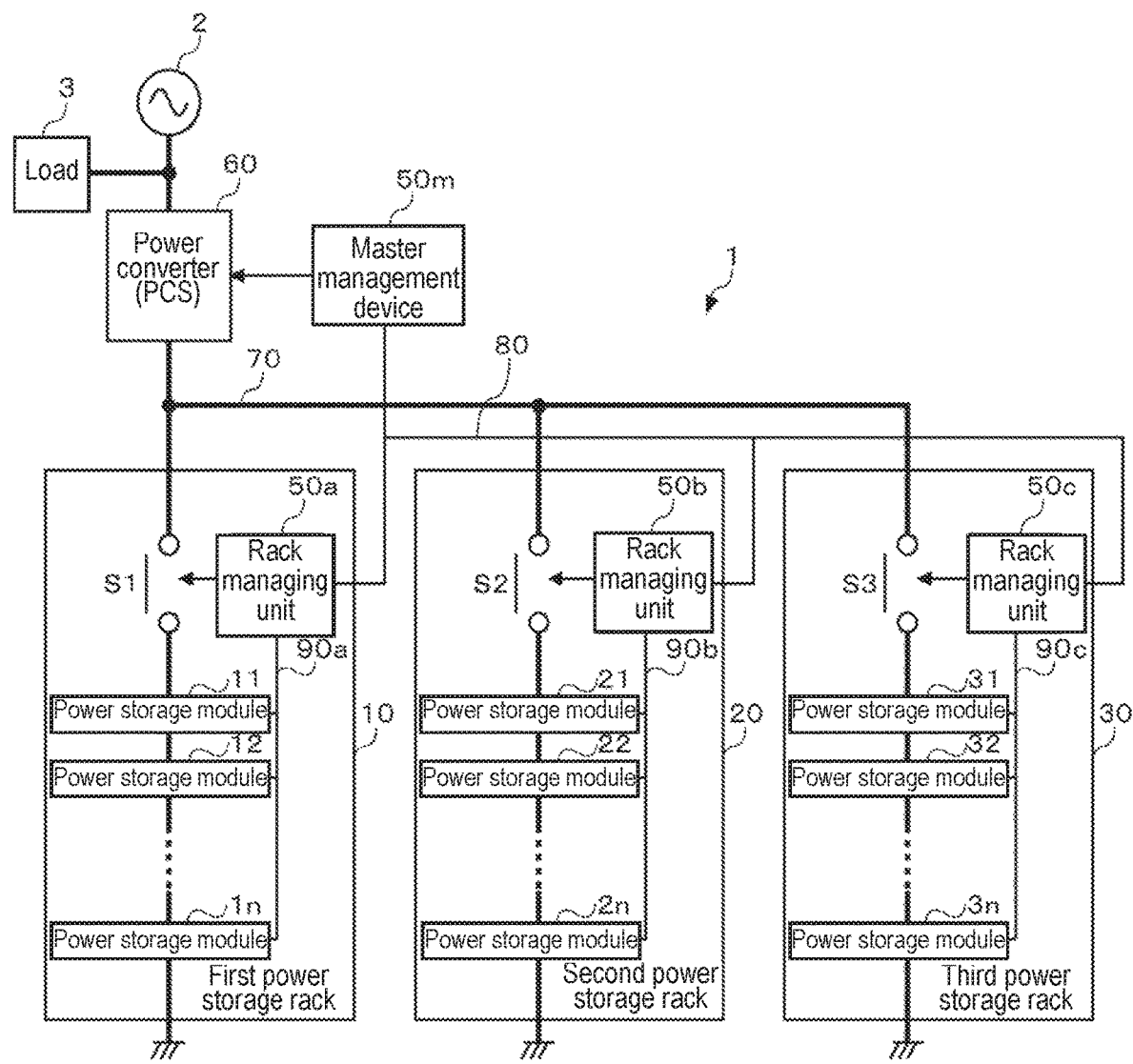
FIG. 1 is a view showing a configuration of a power storage system according to a first exemplary embodiment of the present invention.

FIG. 1 is a view showing a configuration of power storage system 1 according to a first exemplary embodiment of the present invention. Load 3 is connected to a distribution line between power storage system 1 and power system (power grid) 2. Power storage system 1 includes a plurality of power storage racks connected in parallel, power converter (power conditioning system (PCS)) 60, and master management device 50m. FIG. 1 shows an example where three power storage racks (first power storage rack 10, second power storage rack 20, and third power storage rack 30) are connected in parallel to power converter 60.

Power converter 60 converts direct current (DC) power discharged from the plurality of power storage racks 10 to 30 into alternating current (AC) power and outputs the AC power to power system 2 or load 3, and converts AC power inputted from power system 2 into DC power and charges the plurality of power storage racks 10 to 30 connected in parallel. Power converter 60 can be formed of a general-purpose power conditioner, and includes a bidirectional inverter and a controlling circuit, and further includes a bidirectional DC/DC converter when necessary. In the description made hereinafter, an example is assumed where power converter 60 includes the bidirectional DC/DC converter.

The bidirectional DC/DC converter can control a current and a voltage of DC power charged into or discharged from the plurality of power storage racks 10 to 30. The bidirectional DC/DC converter can perform constant current (CC)/constant voltage (CV) charging or CC/CV discharging, for example. The bidirectional inverter executes the conversion of power from DC power into AC power or the conversion of power from AC power into DC power. In accordance with instructions from master management device 50m, the controlling circuit controls the bidirectional DC/DC converter and the bidirectional inverter. In the case where power converter 60 does not include the bidirectional DC/DC converter, the bidirectional inverter executes also a control of a current and a voltage.

First power storage rack 10 includes a plurality of power storage modules 11 to 1n connected in series, first rack managing unit 50a, and first switch S1. Power storage modules 11 to 1n each include a plurality of cells connected in series or in series and in parallel, and monitoring circuits. As the cell, a lithium ion battery cell, a nickel hydride battery cell, an electric double layer capacitor cell, or a lithium ion capacitor cell and the like can be used, for example. It is assumed hereinafter that the lithium ion battery cell is used as the cell, for example.

The monitoring circuit in each of power storage modules 11 to 1n detects voltages, currents, and temperatures of the plurality of cells in each of power storage modules 11 to 1n. The monitoring circuit transmits the detected voltages, currents, and temperatures of the cells to first rack managing unit 50a via in-rack communication line 90a. The communication between each of the monitoring circuits and first rack managing unit 50a may be serial communication conforming to RS-485 specifications, for example. The monitoring circuits and first rack managing unit 50a may be connected to each other through wireless communication or may be connected to each other via a power line communication.

First switch S1 is interposed between power line 70 connected to power converter 60 and the plurality of power storage modules 11 to 1n which are connected to each other in series. As first switch S1, a mechanical relay or a semiconductor switch can be used, for example.

First rack managing unit 50a can be realized by a cooperative operation of a hardware resource and a software resource. As the hardware resource, a microcomputer, a digital signal processor (DSP), a field programmable gate array (FPGA), other large scale integrations (LSIs), or an analog element can be used. As the software resource, a program such as firmware can be used. First rack managing unit 50a receives voltages, currents, and temperatures of the respective cells from the monitoring circuits of power storage modules 11 to 1n via in-rack communication line 90a.

First rack managing unit 50a estimates a state of charge (SOC) and a state of health (SOH) of the cells based on received voltages, currents, and temperatures of the cells. The SOC and the SOH of the cells may be estimated by the monitoring circuits of respective power storage modules 11 to 1n.

The SOC can be estimated by a current integration method or an open circuit voltage (OCV) method. The SOH is specified by a ratio of present full charge capacity to initial full charge capacity. This value indicates that the lower the numerical value is, the more the degradation progresses. The SOH may be determined by measuring cell capacity through full charging or discharging. The SOH may be estimated based on a standing (=while it is being left) degradation speed and a current degradation speed that are acquired in advance by an experiment or a simulation. The standing degradation speed is mainly decided based on an SOC and a temperature, and the current degradation speed is mainly decided based on an integrated current amount and a temperature. First rack managing unit 50a can estimates a standing degradation degree based on a standing degradation speed, an SOC, and a temperature, calculates a current degradation degree based on a current degradation speed, an integrated current amount, and a temperature, and can estimate a SOH of the cell by adding both the standing degradation degree and the current degradation degree.

First rack managing unit 50a estimates a state of power (SOP) for discharging first power storage rack 10, and a state of power (SOP) for charging first power storage rack 10. The SOP for discharging first power storage rack 10 indicates maximum power dischargeable from first power storage rack 10, the SOP for charging first power storage rack 10 indicates a maximum power chargeable to first power storage rack 10. An SOP (=SOPd) for discharging can be obtained by multiplying maximum discharge current Id that is not lower than a lower limit voltage (discharge termination voltage) Vmin of first power storage rack 10 by terminal voltage V of first power storage rack 10 (see following equations 1, 2). On the other hand, an SOP (=SOPc) for charging can be obtained by multiplying maximum charge current Ic that is not above upper limit voltage (full charge voltage) Vmax of first power storage rack 10 by terminal voltage V of first power storage rack 10 (see following equations 3, 4).

$$SOPd = IdV \quad \text{(Equation 1)}$$

$$Id = (E - V\text{min})/R \quad \text{(Equation 2)}$$

$$SOPc = IcV \quad \text{(Equation 3)}$$

$$Ic = (V\text{max} - E)/R \quad \text{(Equation 4)}$$

Symbol E indicates an electromotive force, and symbol R indicates an internal resistance.

Electromotive force E depends on an SOC and has a relationship where the higher the SOC is, the higher electromotive force E becomes. An SOP(=SOPd) for discharging becomes zero when first power storage rack 10 reaches lower limit voltage Vmin. An SOP (SOPc) for charging becomes zero when first power storage rack 10 reaches upper limit voltage Vmax.

First rack managing unit 50a may estimate the SOP by looking up a table which describes the relationship between SOC and SOP that is acquired in advance by an experiment or a simulation. The SOP calculated by above-mentioned equations 1, 3 decreases along with the decrease of the SOH. Accordingly, the present SOP can be estimated by multiplying an SOP in an initial state identified by looking up the table by a present SOH.

An SOP of each of the power storage racks is not limited to values defined by above-mentioned equations 1, 3 and may be simply treated as being equal to maximum rated power of the power storage rack. In this case, an SOP for discharging an power storage rack at the time of stopping discharging of each single power storage rack (SOC=0%) is set to 0, and at a point of time that SOC becomes 2% (SOC=2%), for example, the SOP for discharging is returned to a value equal to maximum rated power of the power storage rack. Further, an SOP for charging the power storage rack at the time of fully-charged state (SOC=100%) is set to 0, and at a point of time that the SOC becomes 98% (SOC=98%), for example, the SOP for charging the power storage rack is returned to a value which is equal to maximum rated power of the power storage rack. When a charging method is pseudo CC/CV, there may be also a case where an SOP for charging is gradually decreased from maximum rated power of the power storage rack to a small value.

First rack managing unit 50a is connected with master management device 50m, second rack managing unit 50b of second power storage rack 20, and third rack managing unit 50c of third power storage rack 30 via inter-rack communication line 80. Communication via inter-rack communication line 80 may be conducted using a communication method conforming to specifications of RS-485, Ethernet (registered trademark), or a controller area network (CAN), for example.

First rack managing unit 50a transmits monitoring data on first power storage rack 10 (battery information) to master management device 50m via inter-rack communication line 80. Battery information may include voltages, currents, power, temperatures, SOCs, SOHs, SOPs for discharging the power storage racks, and SOPs for charging the power storage racks of cell. During a period where power storage system 1 is stopped, a measured value of a current is basically set to 0. In a state where first switch S1 to third switch S3 are turned on, there may be a case where a cross current component between first power storage rack 10 to third power storage rack 30 is measured. Voltages of the cells are basically measured in the form of closed circuit voltage (CCV). In a case where a switch which opens both ends of the cell is provided, it is possible to measure a voltage of a cell in the form of open circuit voltage (OCV).

Second and third power storage racks 20 and 30 are similar in configuration and the manner of operation to first power storage rack 10 and hence, the description of the configuration and the manner of operation of second and third power storage racks 20 and 30 is omitted.

Master management device 50m is realized by a cooperative operation of a hardware resource and a software resource. As the hardware resource, a microcomputer, a DSP, an FPGA, other LSIs, or an analog element can be used. As the software resource, a program such as firmware can be used. Master management device 50m communicates with rack managing units 50a to 50c via inter-rack communication line 80 and manages the plurality of power storage racks 10 to 30. Master management device 50m transmits control signals to the controlling circuit of power converter 60.

Master management device 50m calculates an SOP for discharging a whole of the plurality of power storage racks 10 to 30 connected in parallel (hereinafter referred to as a charging system SOP), and an SOP for charging a whole of the plurality of power storage racks 10 to 30 (hereinafter referred to as a charging system SOP). The discharging system SOP and the charging system SOP can be calculated by following equations (5) and (6).

$$\text{discharging system SOP} = \text{discharging minimum rack SOP} * (\text{total rack current/maximum rack current}) \quad \text{(equation 5)}$$

$$\text{charging system SOP} = \text{charging minimum rack SOP} * (\text{total rack current/maximum rack current}) \quad \text{(equation 6)}$$

Minimum discharging rack SOP is a smallest value among the discharging SOPs of plurality of power storage racks 10 to 30. Charging minimum rack SOP is a minimum value among the charging SOPs of the plurality of power storage racks 10 to 30. The total rack current is a sum of currents flowing through the plurality of respective power storage racks 10 to 30. The maximum rack current is a largest value among values of currents flowing through the plurality of respective power storage racks 10 to 30. When the SOPs and current values of the plurality of power storage racks 10 to 30 are ideally identical with each other, the system SOP takes a value obtained by multiplying the rack SOP by the number of the parallel-connected racks (3 in the example shown in FIG. 1). On the other hand, the larger a current deviation among the plurality of power storage racks 10 to 30 becomes, the lower the system SOP becomes.

The above-mentioned equations (5), (6) may be replaced with the following equations (7) to (10).

$$\text{discharging system SOP} = \min(\text{discharging system SOP}n) \quad \text{(equation 7)}$$

$$\text{discharging system SOP}n = \text{discharging rack SOP}n \times I/In) \quad \text{equation 8}$$

$$\text{charging system SOP} = \min(\text{charging system SOP}n) \quad \text{equation 9}$$

$$\text{charging system SOP}n = \text{charging rack SOP}n \times I/In) \quad \text{(equation 10)}$$

In indicates a current flowing thorough an n-th power storage rack.

I indicates a sum of currents flowing through the plurality of power storage racks which are connected in parallel (system current).

Master management device 50m set a "power instruction value/current instruction value for discharging" corresponding to the calculated discharging system SOP and "power instruction value/current instruction value for charging" corresponding to the calculated charging system SOP to the controlling circuit of power converter 60. The current instruction value can be calculated by dividing the system SOP by a system voltage, for example. In a case where the usage of master management device 50 is limited to discharging, setting may be performed only with respect to "power instruction value/current instruction value for discharging". In a case where the usage of master management device 50 is limited to charging, in the same manner as described above, setting may be performed only with respect to "power instruction value/current instruction value for charging".

The bidirectional DC/DC converter of power converter 60 controls discharging using "the set power instruction value/current instruction value for discharging" as an upper limit value during discharging. The bidirectional DC/DC converter of power converter 60 controls charging using "the set power instruction value/current instruction value for charging" as an upper limit value during charging. This exemplary embodiment adopts the circuit configuration where no DC/DC converter is interposed between power converter 60 and each of power storage racks 10 to 30. Accordingly, it is not possible to control currents flowing through respective power storage racks 10 to 30 individually. Accordingly, currents corresponding to resistance ratios of the plurality of power storage racks 10 to 30 flow through respective power storage racks 10 to 30.

When the bidirectional DC/DC converter of power converter 60 controls discharging and charging within a discharging system SOP and a charging system SOP, it is possible to prevent power storage system 1 from exceeding a maximum allowable current of the whole system, and it is also possible to prevent respective power storage racks 10 to 30 from exceeding the maximum allowable currents of respective power storage racks 10 to 30.

As descried above, to calculate a discharging system SOP and a charging system SOP, values of currents flowing through respective power storage racks 10 to 30 become necessary. After an operation of power storage system 1 is started, currents flowing through respective power storage racks 10 to 30 can be measured. However, before the operation of power storage system 1 is started, currents flowing through respective power storage racks 10 to 30 cannot be measured.

Conventionally, a "power instruction value/current instruction value" at the time of starting an operation of the bidirectional DC/DC converter of power converter 60 (=at the time of starting charging/discharging) is generally set to a value corresponding to a maximum allowable current of the whole system. However, when irregularities (=variations, or dispersions) in current flowing through the plurality of power storage racks 10 to 30 are large, at the time of starting an operation, there may be a case where a current exceeds the maximum allowable current of any one of the power storage racks. In this exemplary embodiment, the mechanism is introduced for preventing a current from exceeding a maximum allowable current of each of the power storage racks at the time of starting an operation by predicting currents flowing through the plurality of power storage racks 10 to 30 before the operation is started. Hereinafter, the manner of operation before charging/discharging is started and the manner of operation after charging/discharging is started are described in detail.

Figure 2:
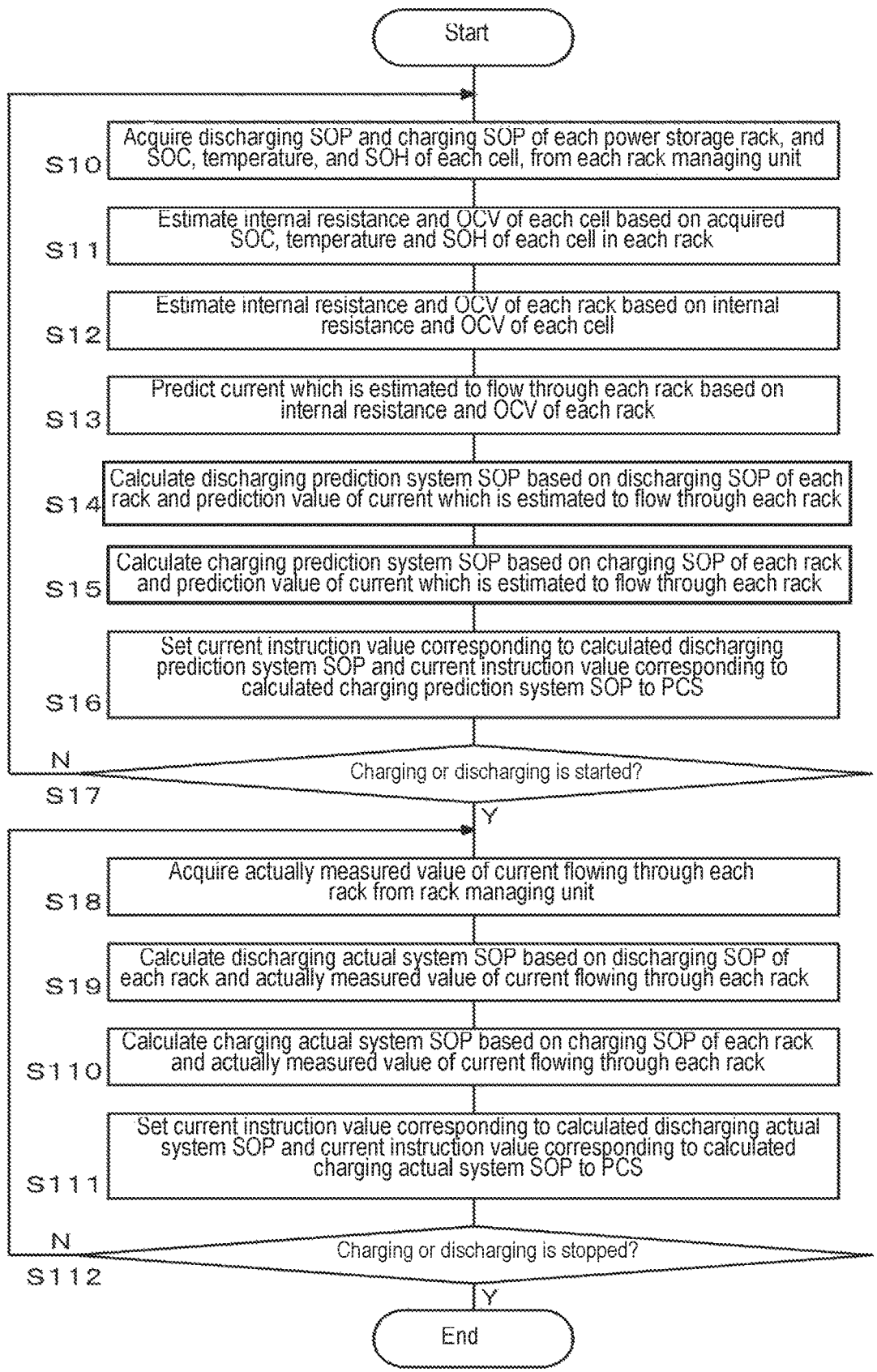
FIG. 2 is a flowchart showing a flow of the manner of operation of the power storage system according to the first exemplary embodiment of the present invention.

FIG. 2 is a flowchart showing the flow of the manner of operation of power storage system 1 according to the first exemplary embodiment of the present invention. Master management device 50*m* acquires discharging SOPs and charging SOPs of the respective power storage racks, and SOCs, temperatures, and SOHs of the respective cells included in the respective power storage racks as battery information of the respective power storage racks from respective rack managing units 50*a* to 50*c* (S10).

Master management device 50*m* estimates internal resistances and OCVs of the respective cells based on acquired SOCs, temperatures and SOHs of the respective cells (S11). The OCV of the cell can be estimated from an SOC-OCV curve of the cell. The internal resistance of the cell can be estimated by looking up a table where the relationship between the internal resistance of the cell preliminarily acquired by an experiment or a simulation and a combination of an SOC, a temperature and an SOH is described.

Master management device 50*m* estimates an internal resistance of the power storage rack by synthesizing internal resistances of the plurality of cells included in the power storage rack for every power storage rack. Master management device 50*m* estimates an OCV of the power storage rack by synthesizing OCVs of the plurality of cells included in the power storage rack for every power storage rack (S12). Master management device 50*m* predicts a current which is estimated to flow through the respective power storage racks from the internal resistances and OCVs of respective power storage racks 10 to 30 (S13).

A current which is estimated to flow through the respective power storage racks can be calculated by solving simultaneous equations described in the following equations (11) to (13). In the following equations (11) to (13), the number of power storage racks connected in parallel is set to m. Before the charging or discharging is started, OCV1, OCV2, OCV3, . . . , OCVm of the respective power storage racks, internal resistances R1, R2, R3, . . . , Rm of the respective power storage racks are known, and voltages V1, V2, V3, . . . , Vm of the respective power storage racks and currents I1, I2, I3, . . . , Im which flow through the respective power storage racks are not yet known.

$$V1=OCV1+I1\times R1, V2=OCV2+I2\times R2, V3=OCV3+I3\times R3, \ldots, Vm=OCVm+Im\times Rm \quad \text{(equation 11)}$$

$$V1=V2=V3\ldots=Vm \quad \text{(equation 12)}$$

$$I=I1+I2+I3+\ldots+Im \quad \text{(equation 13)}$$

Currents I1, I2, I3, . . . , Im which are estimated to flow through the respective power storage racks can be calculated by solving simultaneous equations described in the above-mentioned equations (11) to (13). In the following equations (14) and (15), the equations for calculating currents I1, Im are described. However, currents I2, I3, . . . , I(m−1) can be also calculated in the same manner.

$$I1=(I-((OCV1-OCV2)/R2)-((OCV1=OCV3)/R3)-\ldots-((OCV1-OCVm)/Rm)/(1+R1/R2+R1/R3+\ldots+R1/Rm) \quad \text{(equation 14)}$$

$$Im=I1*R1/Rm+((OCV1-OCVm)/Rm) \quad \text{(equation 15)}$$

Master management device 50*m* calculates the discharging system SOP based on the discharging SOPs of the respective power storage racks and prediction values of currents In which are estimated to flow through the respective power storage racks (S14). For example, using the above-mentioned equations (7) and (8), master management device 50*m* calculates a discharging system SOP (hereinafter referred to as discharging prediction system SOP) based on the discharging SOPns of the respective power storage racks, prediction values of currents In which are estimated to flow through the respective power storage racks, and system current I which is a sum of the prediction values of currents In.

In the same manner, master management device 50*m* calculates the charging system SOP based on the charging SOPs of the respective power storage racks and prediction values of currents In which are estimated to flow through the respective power storage racks (S15). For example, using the above-mentioned equations (9) and (10), master management device 50*m* calculates the charging system SOP (hereinafter referred to as a charging prediction system SOP) based on the charging SOPns of the respective power storage racks, prediction values of currents In which are estimated to flow through the respective power storage racks, and system current I which is the sum of the prediction values of currents In.

Master management device 50*m* sets a current instruction value corresponding to the calculated discharging prediction system SOP and a current instruction value corresponding to the calculated charging prediction system SOP to the controlling circuit of power converter 60 (S16). Before charging or discharging is started by power converter 60 (N in S17), processing from step S10 to step S16 are repeated at a fixed cycle (for example, in one second cycle).

After charging or discharging is started by power converter 60 (Y in step S17), master management device 50*m* acquires actually measured values of currents actually flowing through the respective power storage racks from respective rack managing units 50*a* to 50*c* (S18).

Master management device 50*m* calculates the discharging system SOP based on the discharging SOPs of the respective power storage racks and actually measured values of currents In flowing through the respective power storage racks (S19). For example, using the above-mentioned equations (7) and (8), master management device 50*m* calculates the discharging system SOP (hereinafter referred to as a discharging actual system SOP) based on the discharging SOPns of the respective power storage racks, actually measured values of currents In flowing through the respective power storage racks, and an actually measured value of the system current I.

In the same manner, master management device 50*m* calculates the charging system SOP based on the charging SOPs of the respective power storage racks and actually measured values of currents In flowing through the respective power storage racks (S110). For example, using the above-mentioned equations (9) and (10), master management device 50*m* calculates the charging system SOP (hereinafter referred to as a charging actual system SOP) based on the charging SOPns of the respective power storage racks, actually measured values of currents In flowing through the respective power storage racks, and an actually measured value of the system current I.

Master management device 50*m* sets a current instruction value corresponding to the calculated discharging actual system SOP and a current instruction value corresponding to the calculated charging actual system SOP to the controlling circuit of power converter 60 (S111). During a period where charging/discharging by power converter 60 is continued (N in S112), processing from step S17 to step S111 are repeated at a fixed cycle (for example, in one second cycle). When charging/discharging by power converter 60 is stopped (Y in S112), the processing is finished as a whole.

Figure 3:
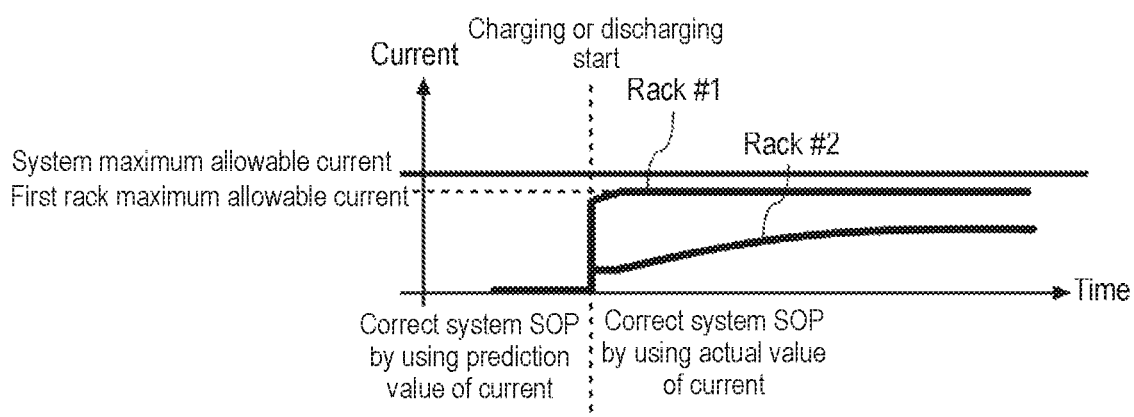
FIG. 3 is a view showing a transition example of a current flowing through each power storage rack before and after starting charging and discharging.

FIG. 3 is a view showing a transition example of an electric current flowing through each power storage rack before and after starting charging or discharging. In FIG. 3, the description is made on the premise that the present invention has the system configuration where two power storage racks are connected in parallel. In an example shown in FIG. 3, an internal resistance of the first power storage rack is relatively smaller than an internal resistance of a second power storage rack, and a current flowing through the first power storage rack is larger than a current flowing through the second power storage rack.

In this exemplary embodiment, before charging/discharging is started, the system SOP is calculated based on prediction values of currents flowing through the respective power storage racks respectively, and after charging/discharging is started, the system SOP is calculated based on actually measured values of currents flowing through the respective power storage rack. As shown in FIG. 3, at the time of starting charging and after charging is started, a current does not exceeds a maximum allowable current of the whole system, and the current does not exceeds also a maximum allowable current of the first power storage rack. On the other hand, if the system SOP is not calculated based on the prediction values of currents flowing through the respective power storage racks before charging/discharging is started, depending on a temperature condition or the like, there is a possibility that a current of the first power storage rack exceeds a maximum allowable current immediately after charging/discharging is started.

As has been described heretofore, according to the first exemplary embodiment, irregularities (=variations, or dispersions) in current between the power storage racks connected in parallel is predicted, and a current instruction value of power converter 60 is limited such that a current does not exceed the maximum allowable current of each power storage rack. With such a configuration, even when there are irregularities in current between the power storage racks connected in parallel, it is possible to prevent a current from exceeding a maximum allowable current of each power storage rack. Further, it is possible to ensure the maximum charging/discharging power within a range where a current does not exceed the maximum allowable current of each power storage rack. Accordingly, it is unnecessary to set the power at the time of starting charging or discharging to a low value more than necessary and hence, it is possible to ensure the capacity of the power storage system at the time of starting the power storage system at maximum while ensuring safety.

Next, a second exemplary embodiment is described. In the first exemplary embodiment, the description is made by taking the case where a control mode is switched from a charging/discharging control by the prediction system SOP to a charging/discharging control by the actual system SOP immediately after charging/discharging is started as an example. In this respect, at a stage where a current flowing through each power storage rack is small, an S/N ratio of a current measured value is bad and hence, there may be a case where an accuracy in controlling charging/discharging by the actual system SOP becomes unstable. In the second exemplary embodiment, the description is made by taking the case where the charging/discharging control is performed using a weighted average value of the prediction system SOP and the actual system SOP immediately after charging/discharging is started as an example.

FIG. 4 is a flowchart showing the flow of the manner of operation of power storage system 1 according to the second exemplary embodiment of the present invention. Processing from steps S20 to S26 in the flowchart show in FIG. 4 are substantially equal to processing from step S10 to step S16 and hence, their description is omitted.

After charging/discharging is started by power converter 60 (Y in step S27), master management device 50*m* acquires actually measured values of currents flowing through the respective power storage racks from respective rack managing units 50*a* to 50*c* (S28). Master management device 50*m* calculates a discharging actual system SOP based on discharging SOPs of respective power storage racks and actually measured values of current In flowing through respective power storage racks (S29), and calculates a charging actual system SOP based on a charging SOP of respective power storage racks and actually measured values of currents In flowing through respective power storage racks (S210).

Master management device 50*m* acquires weighting reference parameters, and calculates a weight of the discharging prediction system SOP and the discharging actual system SOP, and a weight of the charging prediction system SOP and the charging actual system SOP (S211). As the weighting reference parameters, for example, an absolute value of charging/discharging power of power converter 60, a charging/discharging stopping time, maximum temperature change amounts of cells where charging/discharging is stopped, and maximum OCV change amounts of cells where charging/discharging is stopped can be used.

Master management device 50*m* calculates a weighted average value of the discharging prediction system SOP and the discharging actual system SOP based on the weights of the discharging prediction system SOP and the discharging actual system SOP, and generates a discharging current instruction value corresponding to the weighted average value. In the same manner, master management device 50*m* calculates a weighted average value of the charging prediction system SOP and the charging actual system SOP based on the weights of the charging prediction system SOP and the charging actual system SOP, and generates a charging current instruction value corresponding to the weighted average value.

Master management device 50*m* sets the calculated discharging current instruction value and the calculated charging current instruction value in the controlling circuit of power converter 60 (S212). During a period where charging/discharging by power converter 60 is continued (N of S213), processing from step S28 to step S212 are repeated at a fixed cycle (for example, in one second cycle). When charging/discharging by power converter 60 is stopped (Y in S213), the whole processing is finished.

A weighted average value of the discharging prediction system SOP and the discharging actual system SOP, and a weighted average value of the charging prediction system SOP and the charging actual system SOP can be calculated by the following equations (16), (17).

$$\text{Discharging system SOP (weighted average value)} = kd \times \text{discharging prediction system SOP} + (1-kd) \times \text{discharging actual system SOP} \quad \text{(equation 16)}$$

$$\text{Charging system SOP (weighted average value)} = kc \times \text{charging prediction system SOP} + (1-kc) \times \text{charging actual system SOP} \quad \text{(equation 17)}$$

Symbol kd indicates a weight of the discharging prediction system SOP, and symbol kc indicates a weight of the charging prediction system SOP.

Figure 5A:
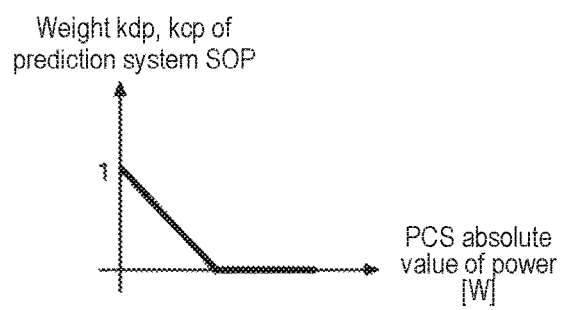
FIG. 5A to FIG. 5D are views showing a specific example of a weighting parameter.

FIG. 5A to FIG. 5D are views showing specific examples of the weighting parameter. FIG. 5A shows an example where weights kdp, kcp are set using absolute values of charging/discharging power of power converter 60 as parameters. The smaller the charging/discharging power of power converter 60 is, the larger the degree of contribution of the prediction system SOP becomes. This is because that, in a stage where the charging/discharging power of power converter 60 is small, accuracy of the actual system SOP is unstable. In the case where charging/discharging power of power converter 60 is 0, the degree of contribution of the prediction system SOP becomes 1 (=the degree of contribution of actual system SOP becomes 0). On the other hand, in the case where charging/discharging power of power converter 60 becomes equal to or more than a predetermined value, the degree of contribution of the prediction system SOP becomes 0 (=the degree of contribution of the actual system SOP becomes 1).

Figure 5C:
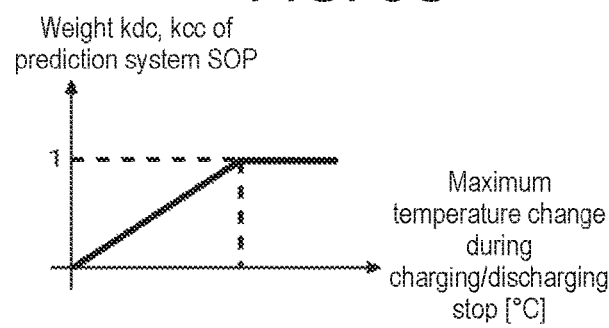
Figure 5B:
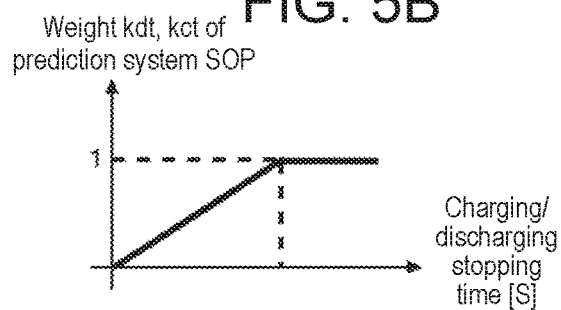

FIG. 5B shows an example where weights kdt, kct are set using the latest charging/discharging stopping time of power storage system 1 as a parameter. The longer the charging/discharging stopping time is, the larger the degree of contribution of the prediction system SOP becomes. This is because there is a tendency that the longer the charging/discharging stopping time is, the lower the reliability of a current measured value immediately after an operation is started becomes.

FIG. 5C shows an example where weights kdc, kcc are set using a maximum temperature change amount of a cell of power storage system 1 in a state where charging/discharging is stopped as a parameter. The larger the maximum temperature change amount of the cell during the charging/discharging is stopped is, the larger the degree of contribution of the prediction system SOP becomes. This is because there is a tendency that the larger a maximum temperature change amount of the cell during the charging/discharging is stopped is, the lower the reliability of a current measured values immediately after an operation is started becomes.

Figure 5D:
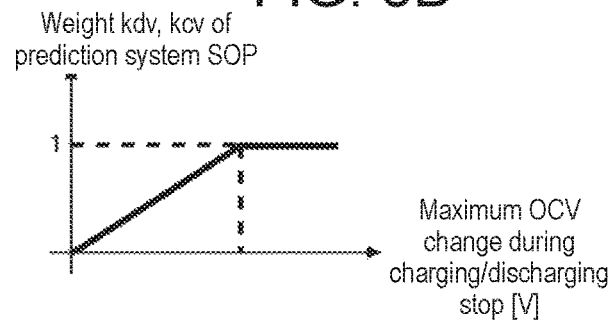

FIG. 5D shows an example where weights kdc, kcc are set using a maximum OCV change amount of a cell of power storage system 1 during the charging/discharging is stopped as a parameter. The larger a maximum OCV change amount of the cell during the charging/discharging is stopped is, the larger the degree of contribution of the prediction system SOP becomes. This is because there is a tendency that the larger the maximum OCV change amount of the cell during the charging/discharging is stopped is, the lower the reliability of a current measured values immediately after an operation is started becomes.

The above-mentioned four kinds of weights can be used independently or in combination. For example, in a case where all of these four kinds of parameters are referenced, the weight kd which is used in the above-mentioned equation (16) is calculated by the following equation (18), and the weight kc used in the above-mentioned equation (17) is calculated by the following equation (19).

$$kd = kdp \times kdt \times kdc \times kdv \quad \text{(equation 18)}$$

$$kc = kcp \times kct \times kcc \times kcv \quad \text{(equation 19)}$$

Further, in a case where the charging/discharging power and the charging/discharging stopping time of power converter 60 are used as weighting parameters, the weight kd which is used in the above-mentioned equation (16) is calculated by the following equation (20), and the weight kc used in the above-mentioned equation (17) is calculated by the following equation (21).

$$kd = kdp \times kdt \quad \text{(equation 20)}$$

$$kc = kcp \times kct \quad \text{(equation 21)}$$

In a case where the charging/discharging power of power converter 60 is included in in-use weighting parameters, at a point of time the charging/discharging power of power converter 60 becomes a predetermine value or more, a control mode is completely switched to a control performed using only the actual system SOP. In a case where the charging/discharging power of power converter 60 is not included in the in-use weighting parameter, after the charging/discharging is started and after a predetermined period is elapsed, the control mode is switched to a control performed only by the actual system SOP.

As has been described heretofore, according to the second exemplary embodiment, it is possible to acquire substantially the same advantageous effects as the first exemplary embodiment. Further, by controlling the charging/discharging using a weighted average value of the prediction system SOP and the actual system SOP immediately after the charging/discharging is started, accuracy in controlling the charging/discharging immediately after the charging/discharging is started can be enhanced. That is, it is possible to compensate for accuracy of the actual system SOP during a period where the charging/discharging power of power converter 60 is small by additionally taking into account the prediction system SOP.

Next, a third exemplary embodiment is described. In the third exemplary embodiment, the description is made with respect to a method of enhancing accuracy of a prediction system SOP by referencing past history information.

Figure 6:
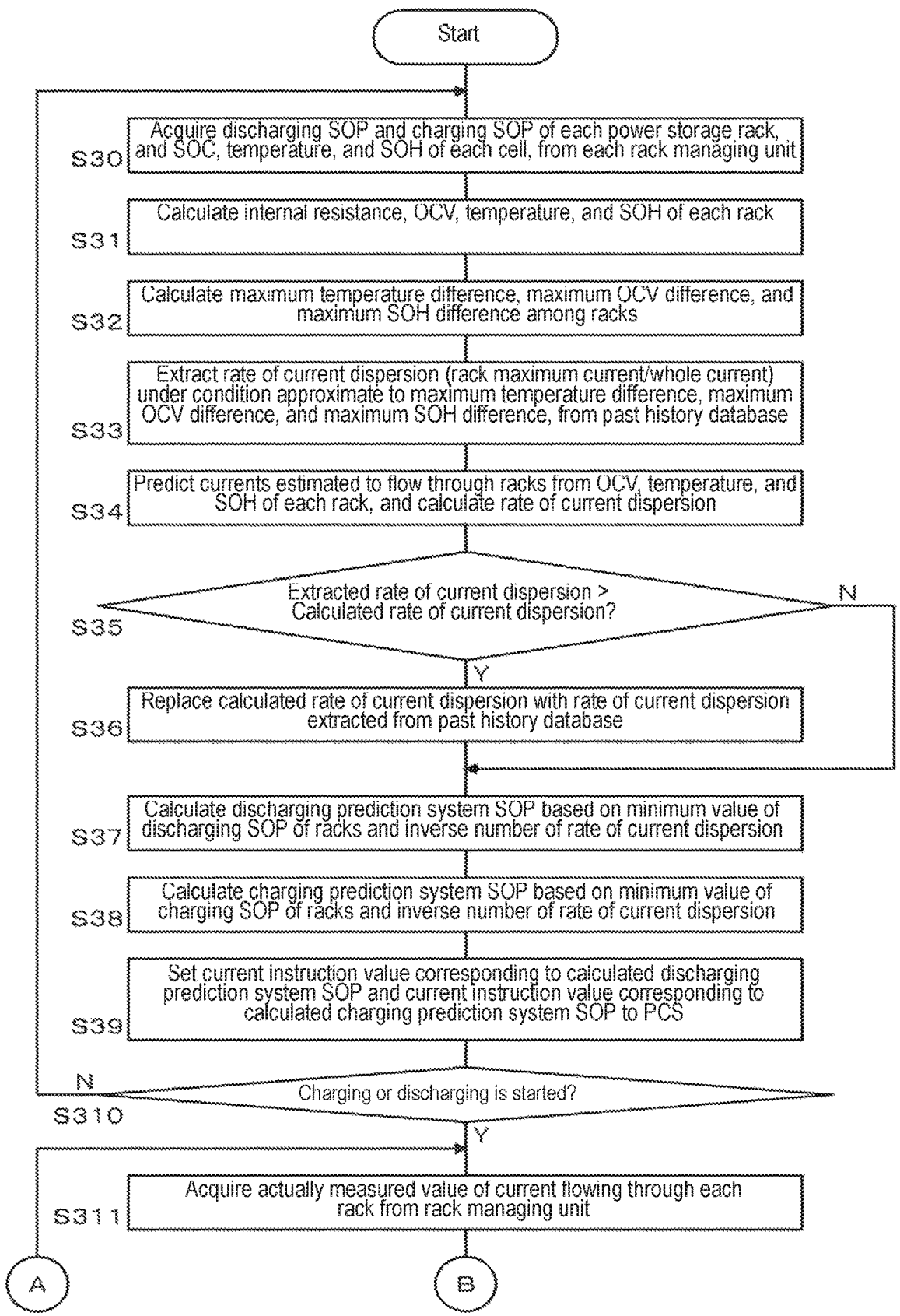
FIG. 6 is a flowchart showing a flow of the manner of operation of a power storage system according to a third exemplary embodiment of the present invention (part 1).
Figure 7:
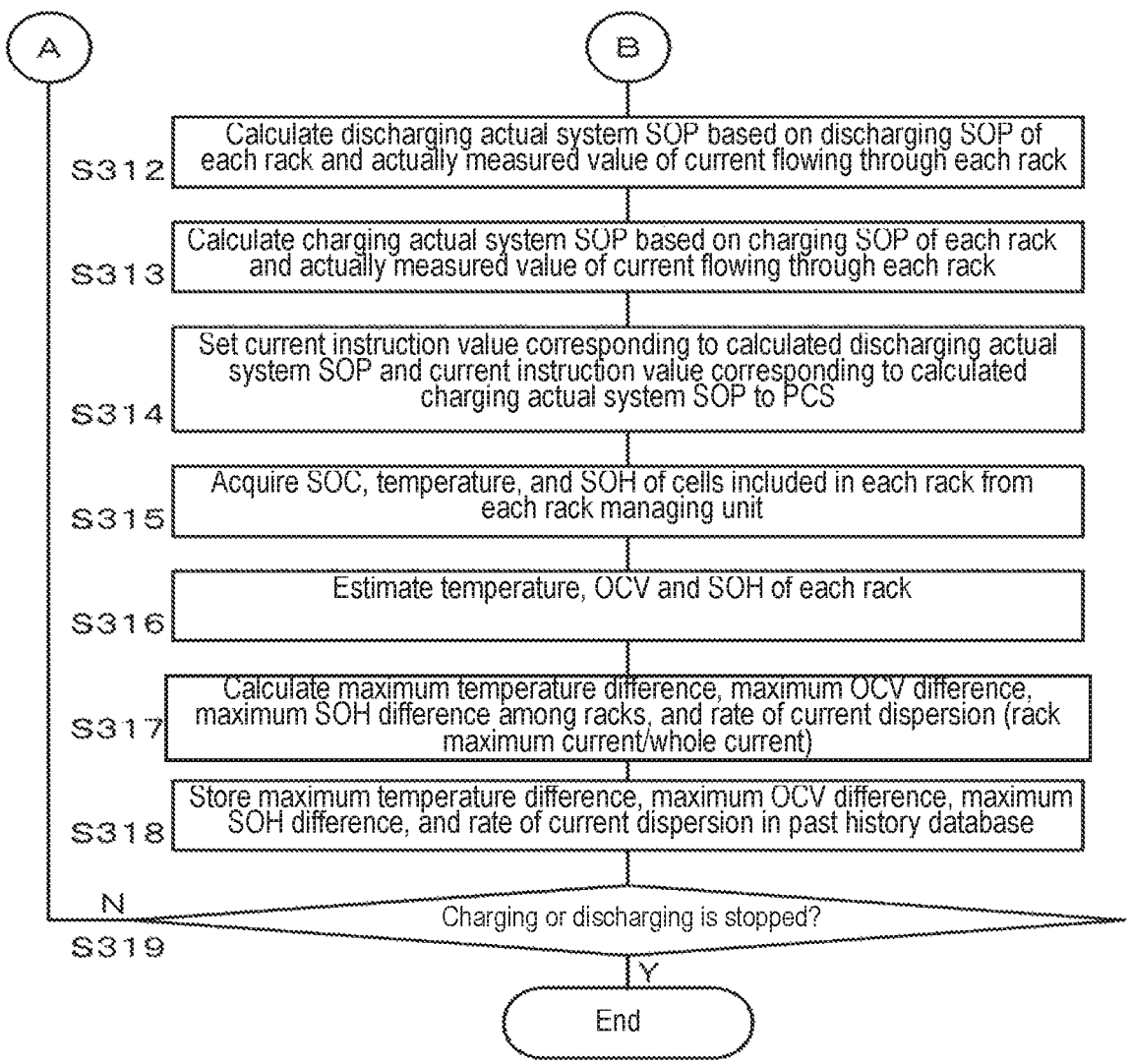
FIG. 7 is a flowchart showing a flow of the manner of operation of the power storage system according to the third exemplary embodiment of the present invention (part 2).

FIG. 6 is a flowchart showing the flow of the manner of operation of power storage system 1 according to the third exemplary embodiment of the present invention (part 1). FIG. 7 is a flowchart showing the flow of the manner of operation of power storage system 1 according to the third exemplary embodiment of the present invention (part 2). Master management device 50m acquires discharging SOPs and charging SOPs of the respective power storage racks, and SOCs, temperatures, and SOHs of the respective cells included in the respective power storage racks as battery information of the respective power storage racks from respective rack managing units 50a to 50c (S30).

Management device 50m calculates internal resistances, OCVs, temperatures, and SOHs of the respective power storage racks (S31). The temperature of the power storage rack can be estimated by calculating an average value or a center value of temperatures of the plurality of cells included in the power storage rack. The SOH of the power storage rack can be estimated by calculating an average value or a center value of SOHs of the plurality of cells included in the power storage rack.

Master management device 50m calculates the maximum temperature difference, the maximum OCV difference, and the maximum SOH difference among the plurality of power storage racks (S32). Master management device 50m retrieves the inside of past history database which master management device 50m stores in itself using the combination of the calculated maximum temperature difference, maximum OCV difference, and maximum SOH difference as a key. The past history database is a database which stores the combination of the maximum temperature difference, the maximum OCV difference, and the maximum SOH difference and a rate of current irregularities under such a condition (rack maximum current/whole current) in a linked manner. Master management device 50m extracts a rate of current irregularities under a condition most approximate to the combination of the calculated maximum temperature difference, maximum OCV difference, and maximum SOH difference (S33). Usually, it is often a case where data which is stored most recently before the charging/discharging is stopped is extracted. The above is not applicable to a case where the charging/discharging stopping period is long.

Master management device 50m predicts internal resistances of respective power storage racks 10 to 30 and currents which are estimated to flow through the respective power storage racks from the OCV, and calculates a rate of current irregularities (rack maximum current/whole current) (S34).

Master management device 50m compares the rate of current irregularities extracted from the past history database and the rate of current irregularities calculated from the prediction values of currents with each other (S35). When the rate of current irregularities extracted from the past history database is larger than the calculated rate of current irregularities (Y in S35), the calculated rate of current irregularities is replaced with the rate of current irregularities extracted from the past history database (S36). When the rate of current irregularities extracted from the past history database is lower than the calculated rate of current irregularities (N in S35), the replacement in step S36 is skipped.

Master management device 50m calculates a discharging system SOP based on minimum values of the discharging SOPs of the plurality of power storage racks and the inverse number of the rate of current irregularities (see the above-mentioned equation (5)) (S37). In the same manner, master management device 50m calculates a charging system SOP based on minimum values of the charging SOPs of the plurality of power storage racks and the inverse number of the rate of current irregularities (see the above-mentioned equation (6)) (S38).

Master management device 50m sets a current instruction value corresponding to the calculated discharging prediction system SOP and a current instruction value corresponding to the calculated charging prediction system SOP to the controlling circuit of power converter 60 (S39). Before charging/discharging is started by power converter 60 (N in S310), processing from step S30 to step S39 are repeated at a fixed cycle (for example, in one second cycle).

After the charging/discharging by power converter 60 is started (Y of S310), master management device 50m acquires actually measured values of currents flowing through the respective power storage racks from respective rack managing units 50a to 50c (S311). Master management device 50m calculates a discharging actual system SOP based on discharging SOPs of respective power storage racks and actually measured value of current In flowing through respective power storage rack (S312), and calculates a charging actual system SOP based on charging SOPs of respective power storage rack and actually measured values of currents In flowing through respective power storage rack (S313).

Master management device 50m sets a current instruction value corresponding to the calculated discharging actual system SOP and a current instruction value corresponding to the calculated charging actual system SOP in the controlling circuit of power converter 60 (S314).

Master management device 50m acquires SOCs, temperatures, and SOHs of the respective cells included in the respective power storage racks from respective rack managing units 50a to 50c (S315). Management device 50m estimates temperatures, OCVs and SOHs of the respective power storage racks (S316). Master management device 50m calculates the maximum temperature difference, the maximum OCV difference, the maximum SOH difference among the plurality of power storage racks, and a rate of current irregularities under such a condition (rack maximum current/whole current) (S317). Master management device 50m stores the calculated maximum temperature difference, maximum OCV difference and maximum SOH difference, and a rate of current irregularities in the above-mentioned past history database in a linked manner (S318).

During a period where charging/discharging by power converter 60 is continued (N of S319), processing from step S311 to step S318 are repeated at a fixed cycle (for example, in one second cycle). When charging/discharging by power converter 60 is stopped (Y in S319), the whole processing is finished.

As has been described heretofore, according to the third exemplary embodiment, it is possible to acquire substantially the same advantageous effects as the first exemplary embodiment. Further, by referencing the past history information where conditions are approximate with each other, accuracy in predicting a current can be enhanced thus enhancing accuracy of the prediction system SOP.

The present invention has been described heretofore with reference to the exemplary embodiments. Those skilled in the art will comprehend that the exemplary embodiment is an example, the combinations of the constituent elements and the processing steps can be modified in various ways, but nevertheless such modifications are included in the scope of the present invention.

In the above-mentioned first to third exemplary embodiments, master management device 50*m* is disposed outside rack managing units 50*a* to 50*c*. However, master management device 50*m* may be disposed in any one of rack managing units 50*a* to 50*c*. That is, the master management device 50*m* may adopt the system configuration where any one of the rack managing units is used as a master unit, and the remaining rack managing units are used as slave units.

In the above-mentioned first to third exemplary embodiments, the description has been made by taking the case where an internal resistance of the cell is estimated from the SOC, the temperature, and the SOH of the cell as an example. However, the internal resistance of the cell may be easily estimated from an SOC/voltage and a temperature without taking into account the SOH. The internal resistance can be estimated by dividing a voltage drop occurring when a constant current flows through a cell for a predetermined time by the constant current. Master management device 50*m* may use an internal resistance which is estimated by correcting a most recent measured value of an internal resistance of the cell using a current temperature.

In the above-mentioned third exemplary embodiment, the description has been made by taking the case where the maximum temperature difference, the maximum OCV difference, and the maximum SOH difference among the plurality of power storage racks, and the rate of current irregularities are stored in the past history database in a linked manner as an example. In this respect, the maximum temperature difference, the maximum OCV difference, and the maximum SOH difference among the plurality of power storage racks, and the actually measured values of currents of the respective power storage racks may be stored in the past history database in a linked manner. In this case, the rate of current irregularities (rack maximum current/whole current) is calculated after being extracted from the past history database.

In the above-mentioned third exemplary embodiment, the description has been made by taking the case where the rate of current irregularities extracted from the past history database and the rate of current irregularities calculated from the prediction value of a current are compared with each other, and when the extracted rate of current irregularities is larger than the calculated rate of current irregularities, the extracted rate of current irregularities are used as an example. In this respect, when the extracted rate of current irregularities is larger than the calculated rate of current irregularities, an average value of the calculated rate of current irregularities and the extracted rate of current irregularities may be used. Further, an average value of the calculated rate of current irregularities and the extracted rate of current irregularities may be used constantly without comparing both rates with each other.

These exemplary embodiments may be specified by items described below.

Item 1

Power storage system (1) including:
a plurality of power storage blocks (10 to 30) connected in parallel;
power converter (60) that converts direct current (DC) power discharged from the plurality of power storage blocks (10 to 30) into alternating current (AC) power to output the AC power to power system (2) or load (3) and converts AC power inputted from power system (2) into DC power to charge the DC power to the plurality of power storage blocks (10 to 30);
master management device (50*m*) that calculates a whole state of power (SOP) that is an SOP of a whole of the plurality of power storage blocks (10 to 30) based on SOPs of respective power storage blocks (10 to 30) and currents flowing through respective power storage blocks (10 to 30), and sets an upper limit value of a power or a current for at least one of charging and discharging by power converter (60), based on the whole SOP thus calculated,
wherein master management device (50*m*) estimates a current flowing through each of power storage blocks (10 to 30) from a voltage and an internal resistances of each of power storage blocks (10 to 30) before power converter (60) starts power conversion.

With such a configuration, before a stage where power converter (60) starts power conversion, it is possible to calculate the suitable whole SOP which reflects a single SOP.

Item 2

Power storage system (1) according to item 1, wherein master management device (50*m*) acquires a state of charge (SOC), a temperature, and a state of health (SOH) of a cell included in each of power storage blocks (10 to 30), estimates an open circuit voltage (OCV) and an internal resistance of the cell from the SOC acquired, temperature, and SOH of the cell, and estimates a current flowing through each of power storage blocks (10 to 30) from the OCV and the internal resistance of the cell.

With such a configuration, even in a state where a current flowing through each of power storage blocks (10 to 30) cannot be measured, it is possible to calculate the suitable whole SOP which reflects the single SOP.

Item 3

Power storage system (1) according to item 1 or 2, wherein master management device (50*m*) calculates the whole SOP based on the SOPs of the respective power storage blocks (10 to 30) and actually measured values of currents flowing through respective power storage blocks (10 to 30) after power converter (60) starts power conversion.

With such a configuration, it is possible to calculate a suitable whole SOP based on the actually measured values of currents flowing through respective power storage blocks (10 to 30) after power converter (60) starts power conversion.

Item 4

Power storage system (1) according to item 3, wherein master management device (50*m*) sets the upper limit value based on the whole SOP which is calculated by weighting and averaging the whole SOP which is calculated based prediction values of currents flowing through respective power storage blocks (10 to 30) and the whole SOP which is calculated based on actually measured values of currents flowing through respective power storage blocks (10 to 30) after power converter (60) starts power conversion.

With such a configuration, it is possible to enhance accuracy of the whole SOP immediately after power conversion is started.

Item 5

Power storage system (1) according to item 4, wherein master management device (50*m*) enhances a degree of contribution of the whole SOP calculated based on actually measured values of currents flowing through respective power storage blocks (10 to 30) as charging and discharging power of power converter (60) are increased after power converter (60) starts power conversion.

With such a configuration, it is possible to compensate for instability of the whole SOP based on the actually measured values in a state where charging/discharging power is small.

Item 6

Power storage system (1) according to any one of items 1 to 5, wherein the master management device (50*m*) extracts actually measured values of currents from past history information approximate to conditions on states of the plurality of power storage blocks (10 to 30) and a temperature condition, and corrects prediction values of currents estimated from voltages and internal resistances of the power storage blocks based on the actually measured values.

With such a configuration, by using the past history information, it is possible to enhance accuracy of prediction values of currents.

Item 7

Management device (50*m*) connected to power storage system (1), power storage system (1) including:
a plurality of power storage blocks (10 to 30) connected in parallel; and
power converter (60) that converts direct current (DC) power discharged from the plurality of power storage blocks (10 to 30) into alternating current (AC) power to output the AC power to power system (2) or load (3), and converts AC power inputted from power system (2) into DC power to charge the DC power to the plurality of power storage blocks (10 to 30),
wherein
management device (50*m*) calculates a whole state of power (SOP) that is an SOP of a whole of the plurality of power storage blocks (10 to 30) based on SOPs of the respective power storage blocks (10 to 30) and currents flowing through the respective power storage blocks (10 to 30), and sets an upper limit value of a power or a current for at least one of charging and discharging by power converter (60) based on the whole SOP thus calculated, and
management device (50*m*) estimates a current flowing through each power storage blocks (10 to 30) from a voltage and an internal resistance of each power storage blocks (10 to 30) before power converter (60) starts power conversion.

With such a configuration, before a stage where power converter (60) starts power conversion, it is possible to calculate the suitable whole SOP which reflects a single SOP.

The invention claimed is:

1. A power storage system comprising:
a plurality of power storage blocks connected in parallel;
a power converter that converts direct current (DC) power discharged from the plurality of power storage blocks into alternating current (AC) power to output the AC power to a power system or a load, and converts AC power inputted from the power system into DC power to charge the DC power to the plurality of power storage blocks; and
a master management device that calculates a whole state of power (SOP) that is an SOP of a whole of the plurality of power storage blocks based on SOPs of the respective power storage blocks and currents flowing through the respective power storage blocks, and sets an upper limit value of a power or a current for at least one of charging and discharging by the power converter, based on the whole SOP calculated,
wherein the master management device estimates a current flowing through each of the power storage blocks from a voltage and an internal resistance of each of the power storage blocks before the power converter starts power conversion.

2. The power storage system according to claim 1, wherein the master management device acquires a state of charge (SOC), a temperature, and a state of health (SOH) of a cell included in each power storage block, estimates an open circuit voltage (OCV) and an internal resistance of the cell from the SOC acquired, temperature, and the SOH of the cell, and estimates a current flowing through each power storage block from the OCV and the internal resistance of the cell.

3. The power storage system according to claim 1, wherein the master management device calculates the whole SOP based on the SOPs of the respective power storage blocks and actually measured values of currents flowing through the respective power storage blocks after the power converter starts power conversion.

4. The power storage system according to claim 3, wherein the master management device sets the upper limit value based on the whole SOP which is calculated by weighting and averaging the whole SOP which is calculated based on prediction values of currents flowing through the respective power storage blocks and the whole SOP which is calculated based on actually measured values of currents flowing through the respective power storage blocks after the power converter starts power conversion.

5. The power storage system according to claim 4, wherein the master management device enhances a degree of contribution of the whole SOP calculated based on actually measured values of currents flowing through the respective power storage blocks as charging and discharging power of power converter are increased after the power converter starts power conversion.

6. The power storage system according to claim 1, wherein the master management device extracts actually measured values of currents from past history information approximate to conditions on states of the plurality of power storage blocks and a temperature condition, and corrects prediction values of currents estimated from voltages and internal resistances of the power storage blocks based on the past actually measured values.

7. A management device connected to a power storage system, wherein the power storage system comprises:
a plurality of power storage blocks connected in parallel; and a power converter that converts direct current (DC) power discharged from the plurality of power storage blocks into alternating current (AC) power to output the AC power to a power system or a load, and converts AC power inputted from the power system into DC power to charge the DC power to the plurality of power storage blocks, and wherein the management device calculates a whole state of power (SOP) that is an SOP of a whole of the plurality of power storage blocks based on SOPs of the respective power storage blocks and currents flowing through the respective power storage blocks, and sets an upper limit value of a power or a current for at least one of charging and discharging by the power converter based on the whole SOP thus calculated, and the management device estimates a current flowing through each power storage block from a voltage and an internal resistance of each power storage block before the power converter starts power conversion.

\* \* \* \* \*